United States Patent [19]

Suzuki

[11] Patent Number: 4,947,371

[45] Date of Patent: Aug. 7, 1990

[54] ANALOG DYNAMIC MEMORY CIRCUIT

[75] Inventor: Tomohiko Suzuki, Tokyo, Japan

[73] Assignee: Addams Systems Inc., Tokyo, Japan

[21] Appl. No.: 330,206

[22] Filed: Mar. 29, 1989

[30] Foreign Application Priority Data

Jul. 19, 1988 [JP] Japan ............................... 63-179462

[51] Int. Cl.⁵ ............................................. G11C 27/00
[52] U.S. Cl. ..................................... 365/45; 365/183;
365/189.07; 365/194
[58] Field of Search ............... 365/45, 189.01, 189.07,
365/183, 194; 307/490, 494

[56] References Cited

U.S. PATENT DOCUMENTS

| 4,280,196 | 7/1981 | Hornak et al. | 365/45 |
| 4,318,188 | 3/1982 | Hoffmann | 365/45 |
| 4,747,075 | 5/1988 | Berggren | 365/45 |
| 4,809,223 | 2/1989 | Brown | 365/45 |

FOREIGN PATENT DOCUMENTS 55-12592  1/1980  Japan.
55-80892  6/1980  Japan.

Primary Examiner—James W. Moffitt
Attorney, Agent, or Firm—Fleit, Jacobson, Cohn, Price, Holman & Stern

[57] ABSTRACT

An analog dynamic memory circuit comprises a time delay element with a variable delay time feedback loop and a time delay element control device which changes the delay time of the time delay element every time when an analog signal circulates in the feedback loop. This analog dynamic memory circuit prevents or avoids superposition of noise signals which have the same phase in the loop circuit, with the result that amplification of noise and tuned waves in the circuit is prevented.

8 Claims, 4 Drawing Sheets

ANALOG DYNAMIC MEMORY CIRCUIT

BACKGROUND OF THE INVENTION

1. Field of the Invention

This invention relates to an analogue dynamic memory circuit for storing analogue signal wave forms which vary in amplitude over time and from which the stored signal wave forms can be read out sequentially and repeatedly.

2. Prior Art Statement

A memory circuit capable of storing analogue signal wave forms which varies over time can be utilizing a time delay element and a feedback loop, as shown in FIG. 2.

This memory circuit is constituted by connecting the output side of a time delay element 1 to the input side thereof via a feedback line 2. The time delay element 1 can be a system with a magnetic recording tape drive head and a reproducing head separated by a certain distance or, alternatively can be a CCD consisting of a plurality of serial charge store cells. When a CCD is used, the analogue signal is transferred from cell to cell in synchronization with a clock signal.

The reference numeral 3 designates a gate circuit which opens for a time period shorter than the delay time to of the delay element 1 and allows an analogue signal to enter from an input terminal 4.

The analogue signal input in this way circulates via feedback line 2 and is thus stored in the feedback loop, which includes the delay element 1.

This circulating analogue signal can be read out sequentially from an output terminal 5. If the feedback loop gain is unity then, theoretically, the signal is stored permanently.

However, when the circulation of an analogue signal is continued over a long period of time in this kind of circuit, the following problems are found to occur.

Although this memory circuit is isolated from the outside by a gate circuit, the quality of the stored analogue signal is degraded by noise or signal sources existing in the loop circuit.

One shot single pulses aside, all repetitive wave forms can be represented as the sum of the sinusoidal wave of the fundamental frequency and the sinusoidal waves of the higher harmonics (i.e. integer multiples) of the fundamental frequency.

Among these sinusoidal waves, those which have frequencies equal to integer multiples of the inverse of the delay time of the analogue dynamic memory system are amplified as tuned waves as the analogue signals circulate in the feedback loop. This makes it impossible to utilize the kind of feedback circuit shown in FIG. 2 in practical applications.

The purpose of this invention is to solve this kind of tuned wave increase problem.

OBJECT AND SUMMARY OF THE INVENTION

The object of this invention is to provide an analogue dynamic memory circuit which prevents or avoids the amplification of tuned waves by changing the delay time of the delay element every time the analogue signal circulates the loop.

By changing the delay time of the delay element every time the analogue signal circulates the loop, the phase difference between newly generated noise signals and the feedback signal from the feedback loop can be made to vary constantly. This prevents superposition of noise signals which have the same phase in the loop circuit, with the result that amplification of noise and tuned waves in the circuit is prevented.

The above and other features of the present invention, will become apparent from the following description made with reference to the drawings.

DETAILED DESCRIPTION OF THE PREFERRED EMBODIMENTS

First Embodiment

Figure 1:
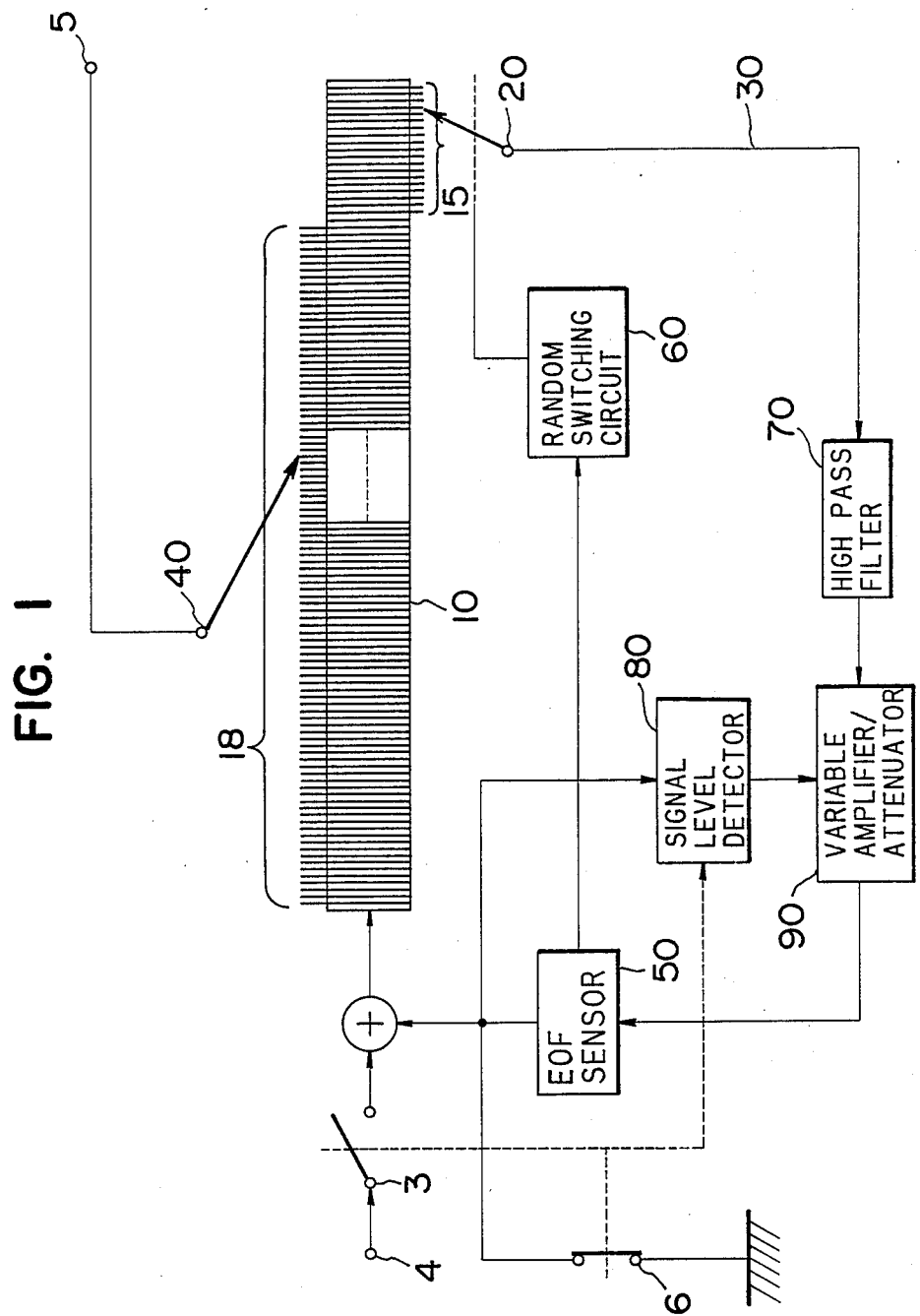
FIG. 1 is a block diagram of a first embodiment of the analogue d in accordance with this invention.
Figure 2:
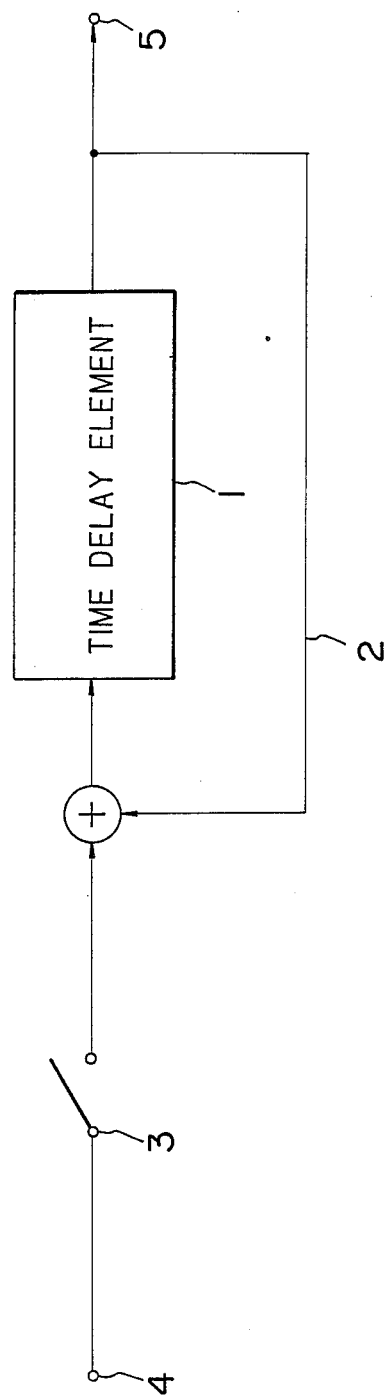
FIG. 2 is a block diagram of the fundamental circuit on which the circuit of the analogue dynamic memory of this invention is based.

FIG. 1 is a schematic drawing of a first embodiment of the memory circuit of this invention.

An analogue signal applied to an input terminal 4 is input to a delay element 10 through a gate circuit 3. At the time of introducing the analogue signal to the delay element 10, this gate circuit 3 opens for the shorter time period than the minimum delay time To of the delay element 10. The introduced analogue signal is continuous over a specific period of time and will be referred to as a worm signal hereinafter. When the gate circuit 3 opens, a BOF (Beginning of File) signal is generated, and the worm signal follows the BOF signal. Similarly an EOF (End of File) signal is attached to the tail of the worm signal when the gate is closed. The worm signal is sandwiched between the BOF and EOF signals.

A block of electronic charge store cells at the rear end of the delay element 10 has a plurality of output feedback terminals 15 for signal feedback.

A selected one of the output feedback terminals 15 is connected to a feedback line 30 via a transfer switch 20. The worm signal fed back to the input side of the delay element 10 via the feedback line 30 travels along the delay element 10 synchronously with transfer clock pulses.

In the circuit of this embodiment, the delay element 10 has a plurality of output terminals 18, one of which is selected by a switch 40, to be connected to an output terminal 5. The switch 20 switches different ones of the feedback terminals 15 for connection with the feedback line 30 so as to prevent amplification of tuned waves from internal or external noise sources. This switching is carried out each time an EOF sensor 50 in the feedback line 30 detects an EOF signal.

In this embodiment, the switching among the feedback terminals 15 is conducted at random under the control of a random switching circuit 60. A high-pass filter (HPF) 70 is included in the loop. This HPF 70 attenuates the amplitude of waves whose frequency is equal to the inverse of the delay time of the memory circuit and lower integer multiple harmonics thereof. Thus, the HPF 70 prevents further amplification of tuned waves in these frequency areas.

The feedback loop also includes a signal level detector 80 and a variable attenuator and/or amplifer 90.

This keeps the amplitude of the worm signal constant within a specific range.

The amplitude of the BOF and EOF signals is constantly monitored by the signal level detector 80. If the level (amplitude) falls below a predetermined minimum level, the amplification by the variable amplifier/attenuator 90 is raised and the worm signal is amplified. If the amplitude of the worm signal exceeds the predetermined maximum level, the attenuation of the variable amplifier/attenuator 90 is increased. When the amplitude of the worm signal is within the predetermined level range, the amplification by the variable amplifier/attenuator 90 is proper for compensating for the total attenuation of the feedback loop.

When no worm signal is circulating in the analogue dynamic memory, the switch 6 is closed. Thus the input of the feedback loop is always grounded when no signal is applied, which prevents increase of tuned waves in the feedback loop. When a worm signal is introduced into the feedback loop, that is, when the switch 3 is closed, a BOF signal is generated. Then the switch 6 opens and input grounding is released.

An explanation will now be given of applications of the analogue dynamic memory of this invention.

Second Embodiment

The number of cells in a delay element such as a CCD is limited. Thus the time length of a worm signal which can be stored in an analogue dynamic memory circuit constituted using such a delay element is also limited.

In this embodiment the memory circuit according to the first embodiment constitutes a particular kind of memory unit and will be referred to as a "volume".

In general, the analogue signal to be stored is longer in time length than the time storage capacity of a single volume so that it is impossible to store the analogue signal in one volume.

Figure 3:
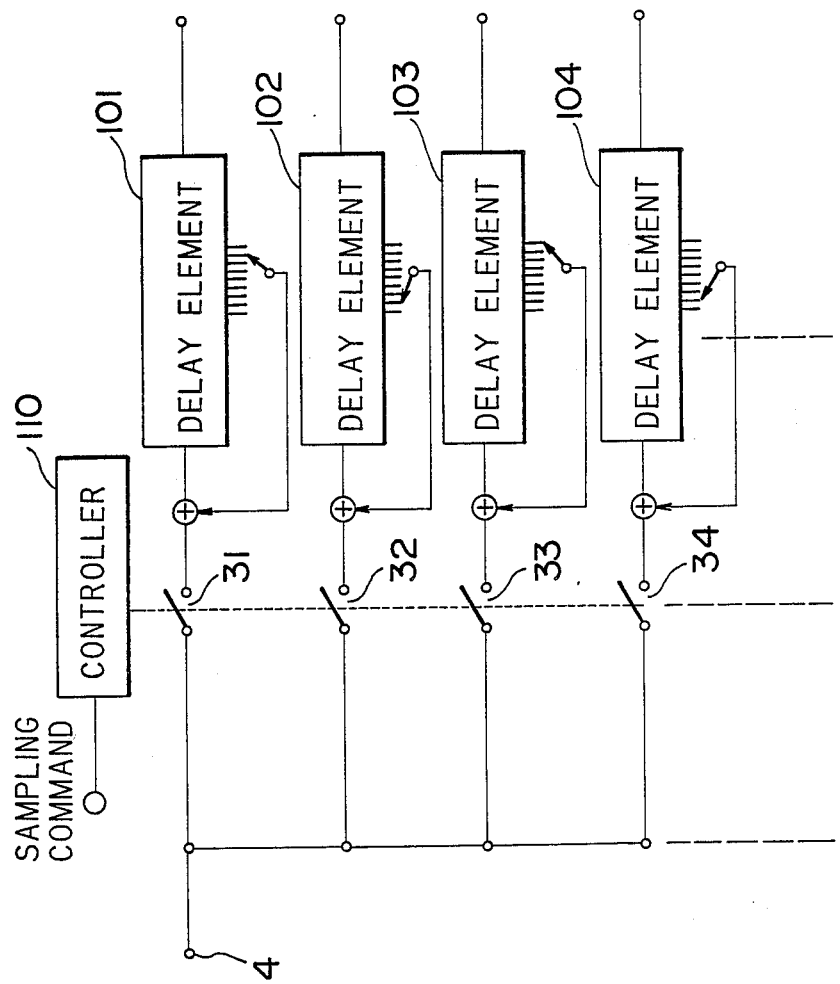
FIG. 3 is a block diagram of an analogue signal multivolume system employing the analogue dynamic memory of this invention.

Thus for storing long-term analogue signals, the circuit shown in FIG. 3 is used. This circuit has a plurality of volumes 101, 102, 103, 104 arranged to enable writing in and reading out of analogue signal in time sequence. The inputs of volumes 101, 102, 103, 104 are connected to the input stored terminal 4 to which the analogue signal to be stored is supplied, via gates 31, 32, 33 and 34. The gate circuits 31–34 at the input terminals of the respective volumes are controlled by a controller 110, which receives a sampling command as input. The gate circuit 31 of the first volume 101 closes for a certain time period equal to the memory time length of the volume. When the gate 101 opens, the gate to the next volume 32 closes instantaneously whereafter the next time period of the analogue signal is input to the volume 32. This operation is repeated sequentially for the series of volumes. Thus an analogue signal of a time length equal to the sum of the time lengths of the individual volumes is stored in this circuit system.

Third Embodiment

Figure 4:
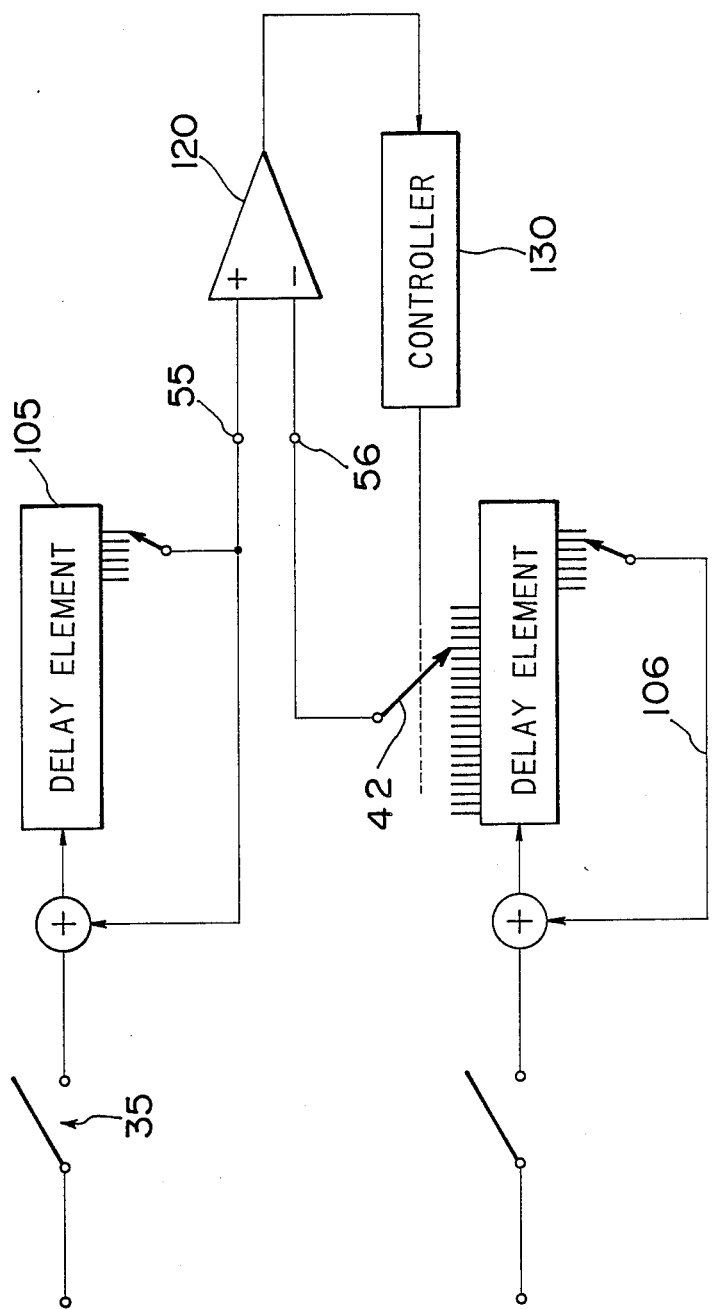
FIG. 4 is a block diagram of a worm signal comparator employing the analogue dynamic memory of this invention.

FIG. 4 is a block diagram, of another embodiment of this invention. This embodiment allows for comparison of two worm signals. A signal stored in one volume is compared with another signal in another volume. This enables a judgment as to whether the two signals are identical, similar or different.

A signal to be tested is stored in a volume 105, which is of the type shown in FIG. 1, via gate circuit 35. This stored worm signal is constantly read out from an output terminal 55. A file data signal is stored in a second volume 106. The output of the second volume is derived from an arbitrary position of the delay element by a switch 42 connected to an output terminal 56. The outputs of the two volumes are connected to the two inputs of a differential amplifier 120.

If the output of the differential amplifier is zero, the two signals are identical. If it is a DC value, the two have similar wave forms. If it is time variant, in other words, if the output is a function of time and its amplitude changes like another signal, the two signals under comparison are different.

However, even if the two signals input to the differential amplifier are identical, there is a good possibility of their being identified as different if there is a phase or time difference in the comparison process.

Accordingly, if the two signals are identified as different, the output of the volume 106 is shifted by a preset minimum unit time by switch 42. This operation is repeated until the two signals are identified as identical. However, if they are not found to be identical after completing a check along the whole delay network, they are then identified as different, and this switching action is terminated in the multi-volume system.

This checking operation is conducted simultaneously in all volumes for the signal to be tested.

If any of a file in a volume coincides with the signal under test, time-wise or phase-wise, effective testing operation can be made.

In other words, the testing time length for the signal under test is within the memory time length of the volume (analogue memory circuit).

The maximum testing time is theoretically that of a test sequence wherein the output of the volume is sequentially switched over the full range of the delay circuit by a switching action, in the case where the signal under test is identified as different.

THE EFFECT OF THIS INVENTION

This invention enables easy realization of an analogue dynamic memory circuit in noisy circumstance, which has been considered difficult or impossible because noise tuned waves tend to build up in the circuit.

What is claimed is:

1. An analog dynamic memory circuit comprising a feedback loop including a time delay element with a variable delay time, an adding circuit having an output connected to said time delay element and receiving as input an analog signal and the output of said time delay element, and time delay control means which changes the delay time of said time delay element every time said analog signal completely circulates said feedback loop, said time delay control means changing the delay time of said time delay element so that tuned sinusoidal noise signals having frequencies equal to integer multiples of the inverse of the delay time of said time delay element do not add, thereby preventing amplification of said tuned sinusoidal noise signals.

2. The analog dynamic memory circuit of claim 1, and further comprising a gate circuit receiving as input an analog signal to be stored and connected to said adding circuit for generating as output said analog signal fed to said adding circuit, said gate circuit opening for a predetermined period of time which is less than a minimum delay time of said time delay element so that said analog signal fed to said adding circuit is continuous over a preset period of time.

3. The analog dynamic memory circuit of claim 2, and further comprising:

feedback switching means connected in said feedback loop and output switching means, and wherein said time delay element includes a plurality of output terminals associated with said output switching means and a plurality of feedback terminals associated with said feedback terminals, said output switching means selecting particular ones of said output terminals for retrieving said stored analog signal;

end of file signal generating means connected in said feedback loop and to said adding circuit for generating an end of file signal indicating the end of said analog signal fed to said adding circuit, said end of file signal being added to the end of said analog signal and following said analog signal to said adding circuit; and wherein said time delay control means comprises random switching means connected to said end of file signal generating means and to said feedback switching means for, upon the presence of an end of file signal, causing said feedback switching means to randomly select different ones of said feedback terminals so as to prevent amplification of said tuned sinusoidal noise signals.

4. The analog dynamic memory circuit of claim 3, and further comprising:

high-pass filter means connected to said feedback switching means in said feedback loop for attenuating the amplitude of signals with frequencies equal to the inverse of the delay time of said time delay element and lower integer multiple harmonics thereof.

5. The analog dynamic memory circuit of claim 4, and further comprising:

variable amplifying/attenuating means connected in said feedback loop between said high-pass filter means and said end of file signal generating means for maintaining the amplitude of said analog signal fed to said adding circuit at a constant amplitude with a specified range.

6. An analog memory system comprising a plurality of analog dynamic memory circuits and control means for controlling said memory circuits, each of said analog dynamic memory circuits comprising:

a feedback loop including a time delay element with a variable delay time, an adding circuit having an output connected to said time delay element and receiving as input an analog signal and the output of said time delay element, and time delay control means which changes the delay time of said time delay element every time said analog signal completely circulates said feedback loop, said time delay control means changing the delay time of said time delay element so that tuned sinusoidal noise signals having frequencies equal t integer multiples of the inverse of the delay time of said time delay element do not add, thereby preventing amplification of said tuned sinusoidal noise signals; and a gate circuit receiving as input an analog signal to be stored and connected to said adding circuit for generating as output said analog signal fed to said adding circuit, said gate circuit opening for a predetermined period of time which is less than a minimum delay time of said time delay element so that said analog signal fed to said adding circuit is continuous over a preset period of time;

said memory system further including a common input terminal connected to the gate circuits of each of said memory circuits, said control means activating said gate circuits sequentially so that discrete portions of an analog signal having a time duration longer than the storage capability of said time delay element are stored in each of said memory circuits.

7. The analog memory system of claim 6, wherein each of said analog dynamic memory circuits further comprises:

feedback switching means connected in said feedback loop and output switching means, and wherein said time delay element includes a plurality of output terminals associated with said output switching means and a plurality of feedback terminals associated with said feedback terminals, said output switching means selecting particular ones of said output terminals for retrieving said stored analog signal;

end of file signal generating means connected in said feedback loop and to said adding circuit for generating an end of file signal indicating the end of said analog signal fed to said adding circuit, said end of file signal being added to the end of said analog signal and following said analog signal to said adding circuit; and wherein said time delay control means comprises random switching means connected to said end of file signal generating means and to said feedback switching means for, upon the presence of an end of file signal, causing said feedback switching means to randomly select different ones of said feedback terminals so as to prevent amplification of said tuned sinusoidal noise signals.

8. The analog memory system of claim 6, and further comprising:

differential amplifier means for comparing the signals stored in two of said plurality of memory circuits and generating an output signal indicative of the similarity between the signals stored in said two memory circuits; and time shifting means responsive to said differential amplifier means for shifting the output of a particular one of said two memory circuits to attempt to identify signals stored in said two memory circuits as identical.

* * * * *